United States Patent [19]

Nishio

[11] Patent Number: 5,177,699

[45] Date of Patent: Jan. 5, 1993

[54] ANALOGUE-TO-DIGITAL CONVERTER HAVING TWO DECIMATE FILTER CIRCUITS RECEIVING OUTPUT OF A FRONT END WHICH IS BIT SHIFTED DOWN IN BEING APPLIED TO ONE OF THE FILTER CIRCUITS

[75] Inventor: Ayataka Nishio, Kanagawa, Japan

[73] Assignee: Sony Corporation, Tokyo, Japan

[21] Appl. No.: 838,316

[22] Filed: Feb. 20, 1992

[30] Foreign Application Priority Data

Feb. 22, 1991 [JP] Japan .................................. 3-028776

[51] Int. Cl.⁵ ............................................. G06F 15/31
[52] U.S. Cl. ................................. 364/724.1; 341/155
[58] Field of Search ....................... 364/724.1, 724.16; 341/155

[56] References Cited

U.S. PATENT DOCUMENTS 4,937,577 6/1990 Rich et al. .................. 364/724.1 X Primary Examiner—Tan V. Mai Attorney, Agent, or Firm—Alvin Sinderbrand; William S. Frommer

[57] ABSTRACT

In an apparatus for converting an analogue signal to a digital signal, the analogue signal is sampled by a sampling pulse having a multiple frequency (N fs, N is an integer) of a nominal sampling frequency (fs) so as to generate an M bit (M is an integer) digital signal, first and second decimate filter circuits receive the M bit digital signal and provide a multiple M (P M, P is an integer) bit digital signal having the nominal sampling frequency fs, the first decimate filter circuit receives the M bit digital signal at upper M input terminals and the second decimate filter circuit receives the M bit digital signal by bit shift down, and the multiple M bit digital signals output from the first and second decimate filter circuits are added to provide a digital output signal. Therefore, when an analogue audio signal is converted into a digital audio signal, the disturbance of lower bit data by higher bit data can be reduced so that the quality of a reproduced sound can be improved.

4 Claims, 5 Drawing Sheets

ANALOGUE-TO-DIGITAL CONVERTER HAVING TWO DECIMATE FILTER CIRCUITS RECEIVING OUTPUT OF A FRONT END WHICH IS BIT SHIFTED DOWN IN BEING APPLIED TO ONE OF THE FILTER CIRCUITS

BACKGROUND OF THE INVENTION

1. Field of the Invention

The present invention generally relates to analogue-to-digital converting apparatus and, more particularly, to an analogue-to-digital converter suitable for processing an audio signal.

2. Description of the Prior Art 16-bit digital signal processors are generally utilized in the professional digital signal processing in the prior art. This type of 16-bit digital signal processor is not necessarily sufficient as a professional digital audio processor from a resolution and dynamic range standpoint. For this reason, digital processors of larger bit size, such as 18-bit to 20-bit digital signal processors, have been requested in order to provide higher resolution and wider dynamic range.

Recently, 18-bit to 20-bit professional analogue-to-digital converting apparatus have become commercially available in order to meet the above demand.

FIG. 1 shows an example of such prior-art analogue-to-digital converter apparatus. As shown in FIG. 1, this kind of known analogue-to-digital converter apparatus comprises an analogue-to-digital (A/D) converting circuit (so-called front end) 10 which employs a so-called Δ-Σ modulation and a digital filter (so-called decimate filter circuit) 20 that converts data of high rate into data of low rate. The front end 10 and the decimate filter circuit 20 are respectively formed of LSIs (large scale integrated circuits).

The front end 10 of FIG. 1 includes, for example, four integrators 11 to 14 connected in series as shown in FIG. 2, and an analogue audio signal SA is supplied through an adder 15 to the integrator 11 of the first stage. An output of the integrator 14 of the final stage is fed through an A/D converter 16, a unit delay circuit 17 and a digital-to-analogue (D/A) converter 18 back to the adder 15, and the unit delay circuit 17 provides output data of, for example, 4 bits.

In the front end 10, the analogue audio signal SA is oversampled at a sampling rate N·fs (e.g., N=128) which is remarkably higher than a sampling rate fs (e.g., 48 kHz) required in the Nyquist chart and then quantized.

Frequency characteristics of the integrators 11 to 14 are set properly and the noise shaping is carried out, so that a noise within the audio signal band is reduced remarkably as shown in FIG. 3.

The decimate filter circuit 20 of FIG. 1 includes, for example, three moving average filters 21 to 23 connected in series, and an output of the moving average filter 23 of the last stage is supplied to a data extracting circuit 24. This data extracting circuit 24 is connected with an FIR (finite impulse response) type half-band filter 25 as shown in FIG. 4.

As shown in FIG. 4, the moving average filter 21 comprises an adder 21a, a subtractor 21b, a unit delay circuit 21d (simply represented by D in FIG. 4] and a shift register 21r having 64 taps.

Input data is commonly supplied to the adder 21a and the shift register 21r and the subtractor 21b subtracts an output of the shift register 21r from an output supplied thereto through the unit delay circuit 21d from the adder 21a. An output of the subtractor 21b is supplied to the adder 21a and an output of the adder 21a is supplied to the circuit of the next stage. The moving average filters 22 and 23 are constructed in a similar fashion.

The moving average filter 21 of the first stage moves and averages 6-bit data of high rate N·fs by an average length 64 to generate 12-bit data of the same rate. The moving average filters 22 and 23 of the next and final stages expand data length by 6 bits each by a similar moving and averaging process and the moving average filter 23 of the final stage derives 24-bit data of rate N·fs.

An over-all frequency characteristic of the moving average filters 21 to 23 is illustrated in FIG. 5.

The data extracting circuit 24 extracts 24-bit data from the output of the moving average filter 23 of the final stage at a rate of 2·fs and omits the lower 4 bits, whereby 20-bit data is supplied to the FIR filter 25 at a rate of 2·fs.

The FIR filter 25 attenuates a component exceeding the audio signal band to thereby generate 20-bit data at a predetermined low rate fs.

In the conventional analogue-to-digital converter apparatus described above, the front end 10 outputs the 4-bit data and the decimate filter circuit 20 is supplied with 6-bit data. Therefore, the output data and input data of the front end 10 and the decimate filter circuit 20, respectively, are not matched.

As a result, by only connecting the output of the front end 10 to the input of the decimate filter circuit 20, the dynamic range of 20 bits, for example, cannot be fully and effectively utilized from LSB (least significant bit) to MSB (most significant bit) in the output of the decimate filter circuit 20. There is then the problem that the performance of such apparatus cannot be demonstrated sufficiently.

More specifically, as shown in FIG. 1, 4 bit outputs of the front end 10 are respectively supplied to the upper 4 bits of the 6 bit inputs of the decimate filter circuit 20, while fixed "1", "0" are respectively supplied to the lower 2 bits of the 6-bit inputs. Thus, the output of the front end 10 is expanded to 6 bits and a DC offset in the output of the decimate filter circuit 20 is reduced.

If the analogue audio signal SA of sufficient level is input to the front end 10 in this state, then the output data thereof is fully and effectively utilized in a range of from "0000" to "1111". When the fixed lower 2 bits "1" and "0" are respectively added to the output data of the front end 10 the 6 bit inputs to the decimate filter circuit 20 are utilized from "000010" to "111110". As a consequence, 20 bit outputs of the decimate filter circuit 20 are represented from "00152" to "FFF57" in a hexadecimal notation with the result that the data is not fully and effectively utilized in a range of the above 16 bits.

As earlier noted, a 16-bit digital processor is generally utilized in the conventional professional audio signal processing. However, when the output of the front end 10 is saturated in the analogue-to-digital converter apparatus shown in FIG. 1, then the output of the decimate filter circuit 20 is not fully and effectively utilized from LSB to MSB. As a consequence, even in the 16-bit digital processor, an overload display function is not operated and there is then the risk that the quality of a reproduced sound is deteriorated.

In order to solve the aforesaid problem fundamentally, it is sufficient to develop a new 6-bit output front end or a new 4-bit input decimate filter circuit. The development of such front end and decimate filter circuit would be costly and time consuming.

In an attempt to solve the aforesaid problem by the use of an external circuit, it has been proposed to employ a digital signal processor (DSP) to amplify the output data of the decimate filter circuit such that 20 bits can be fully and effectively utilized from LSB to MSB.

However, the required DSP involves a large circuit and is very expensive. Also, there is then the problem that re-quantization noise occurs in accordance with the rounding processing in the calculation.

Further, a bit shift adding method is known, in which as shown by a dashed line in FIG. 1 a bit shifter circuit 31 and an adder 32 are employed to process the output data of the decimate filter circuit 20 by bit shift down processing and the processed data is added to the original data, whereby the output data of the decimate filter circuit 20 is amplified such that 20 bits data can be fully and effectively utilized from LSB to MSB.

However, although the bit shift adding method employs a simple circuit and is inexpensive, data of a lower bit is disturbed by data of a higher bit so that a clear reproduced sound cannot be obtained from the listener's standpoint, and the quality of the reproduced sound is deteriorated.

When 4-bit data is processed by the 2-bit shift down processing and added to the original data, then a jump of 2LSB level occurs regularly as shown by * * on the following table 1. In the table 1, OF represents an overflow of data.

| input data | shift data | output data |
|---|---|---|
| H    L | H | H    L |
| 0 0 0 0 | 0 0 | 0 0 0 0 |
| 0 0 0 1 | 0 0 | 0 0 0 1 |
| 0 0 1 0 | 0 0 | 0 0 1 0 |
| 0 0 1 1 | 0 0 | *0 0 1 1 |
| 0 1 0 0 | 0 1 | *0 1 0 1 |
| 0 1 0 1 | 0 1 | 0 1 1 0 |
| 0 1 1 0 | 0 1 | 0 1 1 1 |
| 0 1 1 1 | 0 1 | *1 0 0 0 |
| 1 0 0 0 | 1 0 | *1 0 1 0 |
| 1 0 0 1 | 1 0 | 1 0 1 1 |
| 1 0 1 0 | 1 0 | 1 1 0 0 |
| 1 0 1 1 | 1 0 | *1 1 0 1 |
| 1 1 0 0 | 1 1 | *1 1 1 1 |
| 1 1 0 1 | 1 1 | OF1 1 0 0 |
| 1 1 1 0 | 1 1 | OF1 1 0 1 |
| 1 1 1 1 | 1 1 | OF1 1 1 1 |

OBJECTS AND SUMMARY OF THE INVENTION

Therefore, it is an object of the present invention to provide an improved analogue-to-digital converter in which the aforesaid shortcomings and disadvantages encountered with the prior art can be eliminated.

More specifically, it is an object of the present invention to provide an analogue-to-digital converter of a simple arrangement which can provide a digital signal of a predetermined bit number.

Another object of the present invention is to provide an analogue-to-digital converter in which quality of a reproduced sound can be improved by reducing the disturbance of lower bit data by higher bit data.

As an aspect of the present invention, an analogue-to-digital converter for converting an analogue signal to a digital signal is comprised of an analogue-to-digital converting circuit for sampling the analogue signal by a sampling pulse having a multiple frequency (N·fs, N is an integer) of a nominal sampling frequency (fs) so as to generate an M bit (M is an integer) digital signal, first and second decimate filter circuits connected to the analogue-to-digital converting circuit for receiving the M bit digital signal and for providing a multiple M (P·M, P is an integer) bit digital signal having the nominal sampling frequency fs, the first decimate filter circuit receiving the M bit digital signal at its upper M input terminals, and the second decimate filter circuit receiving the M bit digital signal by bit shift down, and an adder circuit for adding the multiple M bit digital signals output from the first and second decimate filter circuits.

In the analogue-to-digital converter thus arranged, a jump of a plurality of LSBs in the A/d conversion processing is randomly dispersed and the influence exerted upon lower bit data by higher bit data can be reduced, whereby the quality of a reproduced sound is improved.

The above and other objects, features, and advantages of the present invention will become apparent from the following detailed description of an illustrative embodiment thereof to be read in conjunction with the accompanying drawings, in which like reference numerals are used to identify the same or similar parts in the several views,

DESCRIPTION OF THE PREFERRED EMBODIMENT

Figure 1:
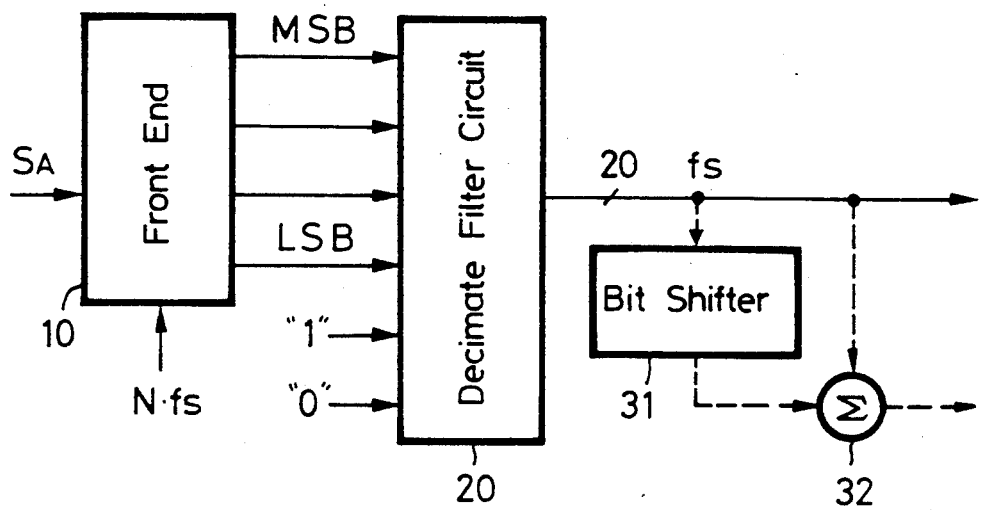
FIG. 1 is a block diagram showing an arrangement of an example of a conventional analogue-to-digital converter.
Figure 2:
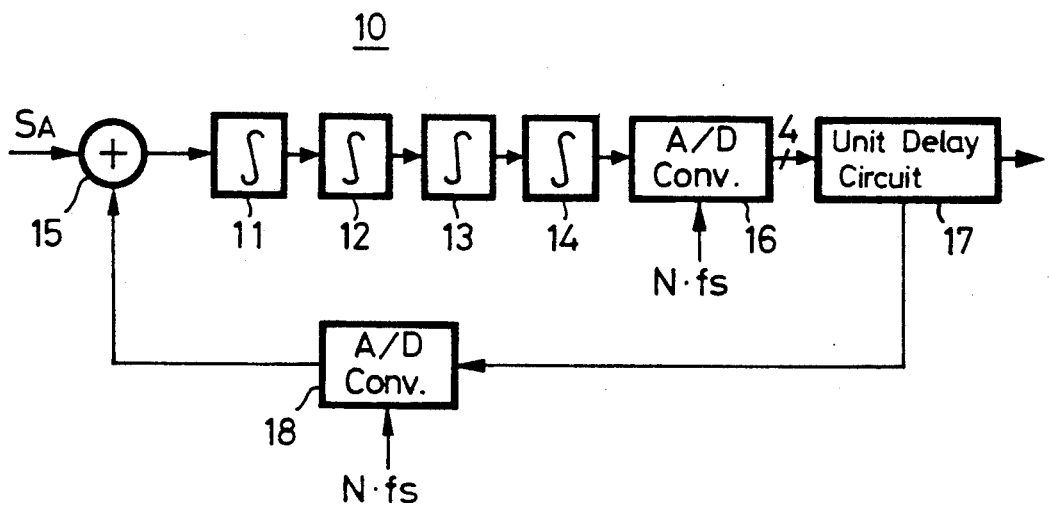
FIG. 2 is a block diagram showing an arrangement of a main portion of the conventional analogie-to-digital converter shown in FIG. 1.
Figure 3:
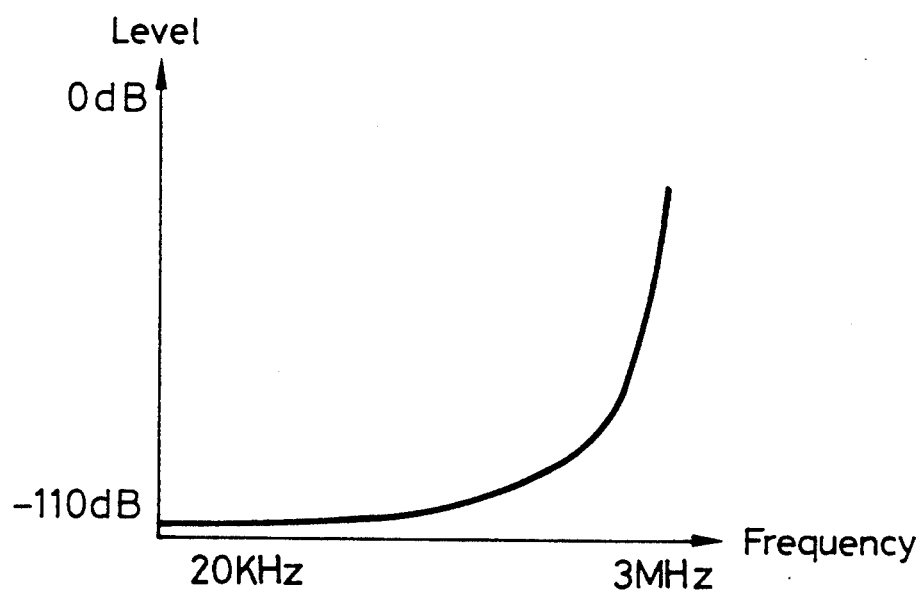
FIG. 3 is a graph showing a characteristic of the main portion of the conventional analogie-to-digital converter.

An analogue-to-digital converter according to an embodiment of the present invention will hereinafter be described with reference to FIG. 6 in which parts corresponding to those described with reference to FIG. 1 are marked with the same references and therefore need not be described in detail.

Figure 4:
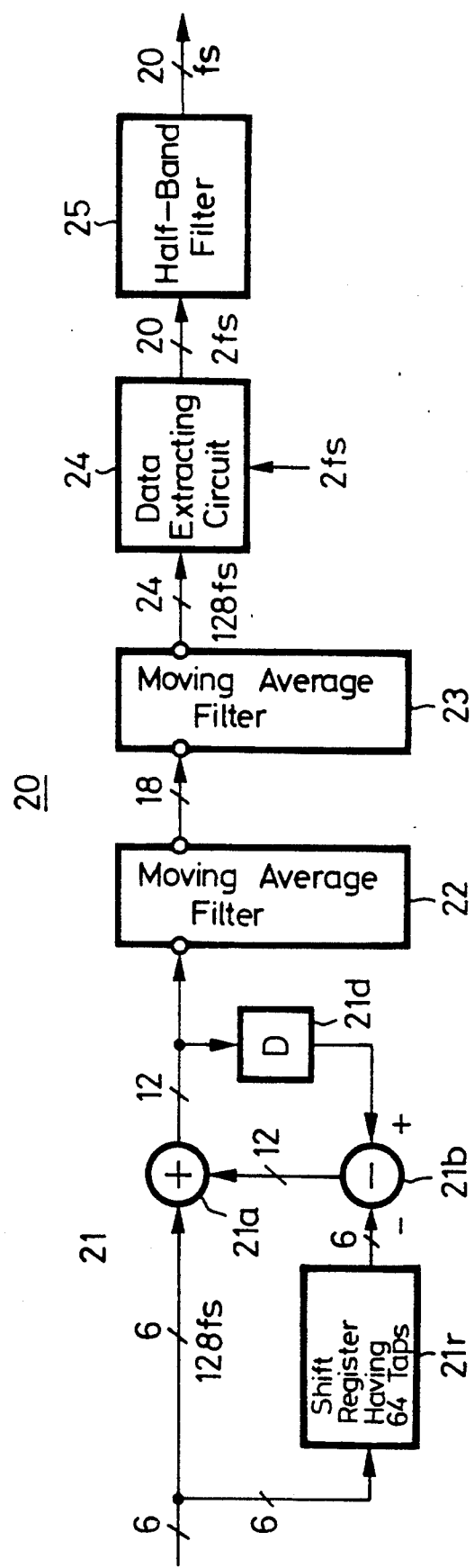
FIG. 4 is a block diagram showing an arrangement of matter main portion of the conventional analogie-to-digital converter shown in FIG. 1.
Figure 5:
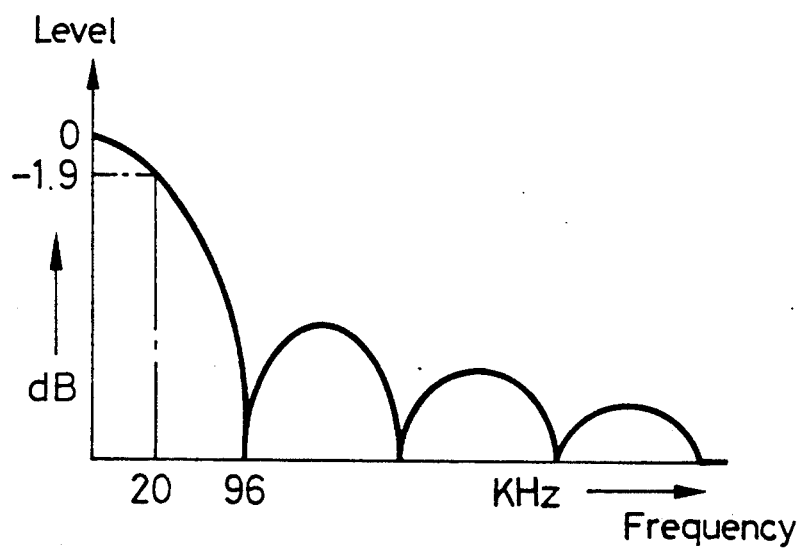
FIG. 5 is a graph showing a characteristic of the other main portion of the conventional analogue-to-digital converter shown in FIG. 4.
Figure 6:
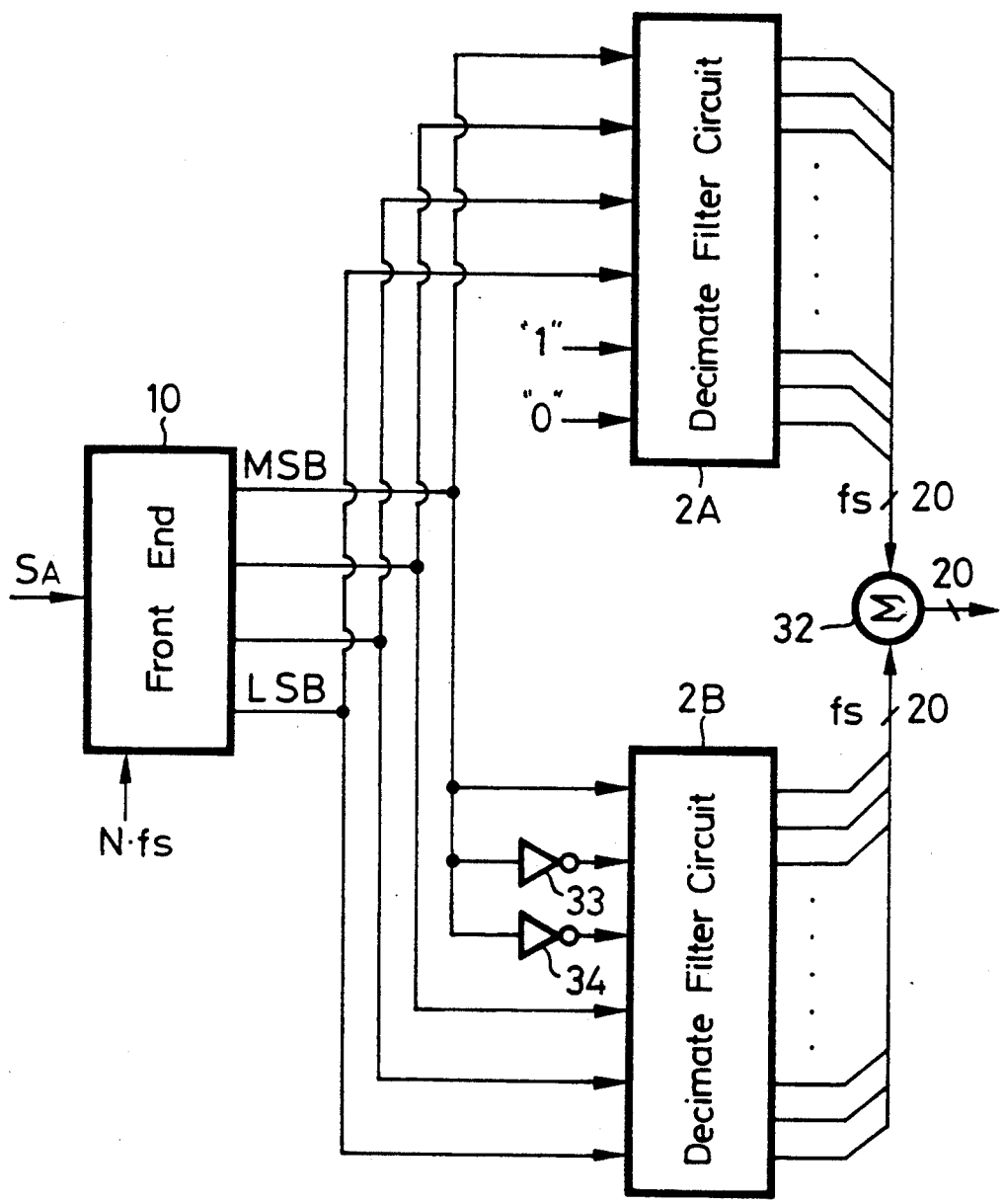
FIG. 6 is a block diagram showing an arrangement of an analogue-to-digital converter according to an embodiment of the present invention.

In FIG. 6, reference numerals 2A and 2B depict 6-bit input decimate filter circuits, respectively, which are constructed similarly to the aforementioned decimate filter circuit 20 shown in FIG. 4.

As shown in FIG. 6, 4 bit outputs of the front end 10 are respectively supplied to upper 4 bits of 6 bit inputs of one decimate filter circuit 2A similarly to FIG. 1. Also, fixed "1" and "0" are respectively supplied to the lower 2 bit inputs of the decimate filter circuit 2A. Thus, the output of the front end 10 is expanded to 6 bits.

Lower 3 bit outputs of the front end 10 are supplied to the lower 3 bits of the other decimate filter circuit 2B and the output of the MSB bit of the front end 10 is supplied to the MSB input of the decimate filter circuit 2B.

MSB outputs of the front end 10 are supplied through inverters 33 and 34 to the second and third inputs, respectively, of the decimate filter circuit 2B.

Thus, the output of the front end 10 is expanded to 6 bits and is also shifted down by 2 bits. 20 bit outputs of both decimate filter circuits 2A and 2B are added by the adder 32 and then delivered.

Operation of the embodiment according to the present invention will be described below.

Since the output of the front end 10 is shifted down by 2 bits and then supplied to the input of the decimate filter circuit 2B described above, the value of the 20-bit output of the decimate filter circuit 2B is reduced to ¼ of the value of the 20-bit output of the decimate filter circuit 2A.

The 20-bit outputs of the two decimate filter circuits 2A and 2B are added by the adder 32 and the value of the 20-bit output from the adder 32 becomes 5/4 (increase of about 1.94 dB) of the value of the 20-bit output of the decimate filter circuit 2A.

As earlier noted, the value of the 20-bit output of the one decimate filter circuit 2A ranges from "00152" to "FFF57" in a hexadecimal notation and is therefore small by about 0.004 dB so that the 20 bits may not be fully and effectively utilized from LSB to MSB.

In the embodiment of this invention shown in FIG. 6, by the above-mentioned bit shift processing, the 20 bit outputs from the adder 32 can be sufficiently and effectively utilized from LSB to MSB.

Further, according to this embodiment, since the bit shift is carried out in the input sides of the two decimate filter circuits 2A and 2B, the LSB of the 20-bit output from the adder 32 is randomly processed by the influence of the calculation within the respective decimate filter circuits 2A, 2B as if it were added with a pseudo random signal, i.e., a so-called dither signal, thus preventing the influence of the higher bit data from being remarkably exerted upon the lower bit data, unlike the conventional simple bit shift processing.

Therefore, a clear reproduced sound can be obtained from the listener's standpoint, that is, the quality of the reproduced sound can be improved.

In a above-mentioned embodiment, since the front end 70 of a Δ-Σ modulation type is employed, the bit shift exceeding 2 bits cannot be made. In case of ordinary digital data, a bit shift of 3 bits or more is made possible by adding a dither signal to the ordinary digital data as below. Further, a loss of dynamic range corresponding to the aforementioned extra gain (about 1.94 dB) can be reduced.

In this case, since the gain can be controlled by the bit shift amount, it is possible to obtain a general purpose analogue-to-digital converter which is substantially similar to the digital amplification employing the digital signal processor (DSP).

1 bit shift +3.52 dB
2 bit shift +1.94 dB
3 bit shift +1.02 dB
4 bit shift +0.53 dB
5 bit shift +0.27 dB
6 bit shift +0.13 dB As set out above in detail, according to the present invention, the analogue-to-digital converter is comprised of the front end which generates data of short word length by oversampling the analogue audio signal by the frequency of N·fs and the pair of decimate filter circuits which lower the data rate of the output of the front end to convert the output of the front end into output data of long word length, with the output of the front end being directly supplied to one decimate filter circuit and the output of the front end being processed by the bit shift down and then fed to the other decimate filter circuit, and with the outputs of the two decimate filter circuits being added. Therefore, when the analogue audio signal is converted into the digital audio signal, the disturbance of lower bit data by the higher bit data can be reduced and the quality of the reproduced sound can be improved from the listener's standpoint.

Having described the preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claims.

What is claimed is:

1. Analogue-to-digital converter for converting an analogue signal to a digital signal comprising:
    (a) an analogue-to-digital converting circuit for sampling said analogue signal by a sampling pulse having a multiple frequency (N·fs, N is an integer) of a nominal sampling frequency (fs) so as to generate an M bit (M is an integer) digital signal;
    (b) first and second decimate filter circuits connected to said analogue-to-digital converting circuit for receiving said M bit digital signal and for providing a multiple M (P·M, P is an integer) bit digital signal having said nominal sampling frequency fs, said first decimate filter circuit receiving said M bit digital signal at upper M input terminals, and said second decimate filter circuit receiving said M bit digital signal by bit shift down; and
    (c) an adder circuit for adding said multiple M bit digital signals output from said first and second decimate filter circuits.

2. The apparatus according to claim 1, in which said integers M, N and P are 4, 128 and 5, respectively.

3. The apparatus according to claim 2, in which said first and second decimate filter circuits have 6 input terminals and said first decimate filter circuit receives said M bit digital signal at upper M input terminals, and said second decimate filter circuit receives 3 bits of said M bit digital signal at lower 3 input terminals and receives a MSB of said M bit digital signal at a MSB input terminal.

4. Analogue-to-digital converter comprising:
    means for sampling an analogue signal by a sampling frequency having a multiple frequency of a nominal sampling frequency and for digitizing a sampled signal so as to generate an M bit digital signal;
    first and second decimate filtering circuits provided with said M bit digital signal from said sampling and digitizing means for decimating said M bit digital signal and for generating a multiple M bit digital signal, said M bit digital signal being at least one bit shifted down and input to one of said first and second decimate filtering circuits; and
    means for adding output signals of said first and second decimate filtering circuits.

* * * * *